United States Patent [19]

Iwase et al.

[11] Patent Number: 5,631,865
[45] Date of Patent: May 20, 1997

[54] DATA OUTPUTTING CIRCUIT FOR SEMICONDUCTOR MEMORY DEVICE

[75] Inventors: Akihiro Iwase; Masaharu Kagohashi, both of Kasugai, Japan

[73] Assignee: Fujitsu Limited, Kanagawa, Japan

[21] Appl. No.: 562,745

[22] Filed: Nov. 27, 1995

[30] Foreign Application Priority Data

Mar. 17, 1995 [JP] Japan ................... 7-059438

[51] Int. Cl.[6] .................................. G11C 7/00
[52] U.S. Cl. ................ 365/189.01; 365/189.11; 365/207
[58] Field of Search .............. 365/189.01, 205, 365/207, 189.09, 189.11

[56] References Cited

U.S. PATENT DOCUMENTS 4,733,112  3/1988  Yamaguchi .................. 365/205

Primary Examiner—Joseph A. Popek
Attorney, Agent, or Firm—Nikaido Marmelstein Murray & Oram LLP

[57] ABSTRACT

A semiconductor memory device includes a sense amplifier and a load circuit which are connected to a pair of data buses through which cell data is read. The sense amplifier produces an output data signal in accordance with voltage potentials of transfer signals on the data buses. During data reading operation of the memory device, the sense amplifier is enabled and the transfer signals on the data buses have a different voltage potential level from each other. The load circuit sets the data buses at a predetermined reset voltage potential in a stand by state of the data reading operation. The reset voltage potential is intermediate of the voltage potential levels of the data buses when the sense amplifier is enabled.

14 Claims, 6 Drawing Sheets

DATA OUTPUTTING CIRCUIT FOR SEMICONDUCTOR MEMORY DEVICE

BACKGROUND OF THE INVENTION

1. Field of the Invention

The present invention relates generally to a semiconductor memory device, more particularly to a data outputting circuit for reading data from a semiconductor memory device.

2. Description of the Related Art

Recent advances in the operational speeds of central processing units have fueled the demand for semiconductor memory devices having higher integrations and faster operational speeds. To achieve this demand, data outputting circuitry for reading cell information from a semiconductor memory device needs to operate at faster speeds.

FIG. 1 illustrates a conventional data outputting circuit incorporated in a semiconductor memory device. A switching circuit 1 is connected to a pair of data buses DB and /DB. Cell information is read from one of memory cells in the memory device. The cell information is then provided as a pair of complementary data to the data outputting circuit of the memory device via the switching circuit 1 and the data buses DB and /DB. The data buses DB and /DB are connected to a load circuit 2 including five P channel MOS transistors Tr1 to Tr5 and two resistors R1 and R2.

The transistor Tr1 has a source connected to a power supply $V_{CC}$ and a drain connected to the data bus DB via the transistor Tr3. The gate and drain of transistor Tr3 are connected to each other. The transistor Tr2 has a source connected to the power supply $V_{CC}$ and a drain connected to the data bus /DB via the transistor Tr4. The transistor Tr4 has its gate and drain connected to each other. The data buses DB and /DB are connected to each other via the transistor TR5. The gates of the transistors Tr1, Tr2 and Tr5 are supplied with a sense amplifier enable signal LE.

The data buses DB and /DB are connected to ground via the resistors R1 and R2, respectively. Each of the resistors R1 and R2 has a resistance value to prevent the voltage potential of the associated data bus DB or /DB from being raised to the high potential $V_{CC}$ by releasing, through the resistor R1 or R2, the tailing current of the transistor Tr3 or Tr4 (i.e., the current when the voltage $V_{GS}$ between its gate and source is zero).

The data buses DB and /DB are connected to a sense amplifier 3 with current mirror circuit configuration. The sense amplifier includes two P channel MOS transistors Tr6 and Tr7 and four N channel MOS transistor Tr8 to Tr11.

As shown in FIG. 1, the transistor Tr6 has a source connected to the power supply $V_{CC}$ and a drain connected to the gates of the transistors Tr8 and Tr9 and to the drain of the transistor 8. The source of the transistor Tr8 is connected to the data bus DB. The transistor Tr7 has a source connected to the power supply $V_{CC}$ and a drain connected to the drain of the transistor Tr9. The source of the transistor Tr9 is connected to the data bus /DB.

The data bus DB is connected to the drain of the transistor Tr10 whose source is grounded. The data bus /DB is connected to the drain of the transistor Tr11 whose source is grounded. The gates of the transistors Tr6 and Tr7 are supplied with an inverted sense amplifier enable signal /LE which is an inverted signal of the signal LE. The gates of the transistor Tr10 and Tr11 are supplied with the sense amplifier enable signal LE.

In the sense amplifier 3, the transistors Tr6 and Tr7 form the first current mirror pair, the transistors Tr8 and Tr9 form the second current mirror pair and the transistors Tr10 and Tr11 form the third current mirror pair. The drains of the transistors Tr7 and Tr9 are connected to an output terminal $T_O$ of the semiconductor memory device. Output data $D_{OUT}$ is produced at the output terminal $T_O$.

The resistance RV6 of the transistor Tr6 when turned on is equal to the resistance RV7 of the transistor Tr7 when turned on. The resistance RV8 of the transistor Tr8 when turned on is equal to the resistance RV9 of the transistor Tr9 when turned on. The resistance RV10 of the transistor Tr10 when turned on is equal to the resistance RV11 of the transistor Tr11 when turned on. Accordingly, the resistance values RV6 to RV11 satisfy the following equation (1).

$$RV6:RV8:RV10=RV7:RV9:RV11 \qquad (1)$$

When the sense amplifier enable signal goes high and the signal /LE goes low, the transistors Tr6, Tr7, Tr10 and Tr11 turn on and the sense amplifier 3 is enabled. The data buses DB and /DB then have the voltage potential determined by dividing the potential difference between the supply voltage $V_{CC}$ and the ground level, following the resistance ratio represented in the equation (1). With this condition, when cell data is read from a memory cell, a slight separation of the voltage potentials of the data buses DB and /DB occurs.

When the voltage potential of the data bus DB is higher than that of /DB, the current through the drain of the transistor Tr8 decreases and the current through the drain of the transistor Tr9 increases. This lowers the voltage potential of the terminal $T_O$, resulting in setting the output data signal $D_{OUT}$ low.

In contrast, when the voltage potential of the data bus DB is lower than that of /DB, the current through the drain of the transistor Tr8 increases and the current through the drain of the transistor Tr9 decreases. This raises the voltage potential of the terminal $T_O$, resulting in setting the output data signal $D_{OUT}$ high.

The above described data outputting circuit enters into the standby state when the sense amplifier enable signal LE is set low and the signal /LE is set high.

When the data outputting circuit is in the standby state, the transistors Tr6, Tr7, Tr10 and Tr11 are turned off so that the sense amplifier 3 becomes disabled, and the transistors Tr1, Tr2, Tr5 are turned on so that the load circuit 2 becomes enabled. In this case, the data buses DB and /DB have a voltage potential set lower than the supply voltage $V_{CC}$ by the threshold voltage of the transistor Tr3 or Tr4.

When the sense amplifier enable signal LE goes high and the signal /LE goes low, the transistors Tr1, Tr2 and Tr5 are turned off so that the load circuit 2 becomes disabled, and the transistors Tr6, Tr7, Tr10 and Tr11 are turned on so that the sense amplifier 3 becomes enabled. With this condition, when cell data is read onto the data buses DB and /DB, an output data signal $D_{OUT}$ according to the cell data is output from the terminal $T_O$ of the sense amplifier 3.

According to the conventional data outputting circuit, when cell data is read successively, the load circuit 2 stays disabled and the sense amplifier 3 stays enabled. As shown in FIG. 2, when one of the data buses DB and /DB goes low from high and the other goes high from low in synchronism with a change in cell data, it takes a reading period of time t1 for the output data signal $D_{OUT}$ to go, for example, from low to high.

When the data outputting circuit is in the standby state, the load circuit 2 stays enabled and the sense amplifier 3 stays disabled. In this case, the data buses DB and /DB have a voltage potential set lower than the supply voltage $V_{CC}$ by the threshold voltage of the P channel MOS transistor Tr3 or Tr4. When the data outputting circuit starts reading operation from the standby state, the voltage potential of each data bus falls to the voltage potential determined by the resistances of the transistors of the sense amplifier 3 when turned on. Specifically, a difference of potential levels develops between the data buses DB and /DB when cell data is read to the data buses DB and /DB. Then, the sense amplifier 3 operates to output the data signal $D_{OUT}$ according to the read cell data. In this case, it takes an operational period of time t2 for the output data signal $D_{OUT}$ to go, for example, from low to high.

In general, the operational time t2 is much longer than the reading time t1. There is a time lag t3 between t1 and t2. The time lag t3 corresponds to the time taken when the voltage potentials of the data buses DB and /DB falls from a reset potential $V_{RESET}$ (i.e., an initial voltage potential in the standby state) to respective voltage potentials during reading operation. Hence, as described above, the operational speed of the conventional data outputting circuit is slow at the initial stage of reading operation, i.e., when shifting from the standby state to the reading operation.

SUMMARY OF THE INVENTION

The present invention pertains to a semiconductor memory device which can read cell data with an improved speed at an initial stage of a reading operation.

An embodiment of a semiconductor memory device is provided with a pair of data buses through which cell data is read, and the memory device includes: a sense amplifier, connected to said pair of data buses, for producing an output data signal in accordance with voltage potentials of transfer signals on said data buses, wherein during a data reading operation of said memory device, said sense amplifier is enabled and said transfer signals on said data buses have a different voltage potential level from each other; and a load circuit, connected to said pair of data buses, for setting said transfer signals on said data buses at a predetermined reset voltage potential during a stand-by state of said memory device, wherein said predetermined reset voltage potential is intermediate between the voltage potential levels of said transfer signals on said data buses when said sense amplifier is thereafter enabled.

BRIEF DESCRIPTION OF THE DRAWINGS

The invention, together objects and advantages thereof, may best be understood by reference to the following description of the presently preferred embodiments together with the accompanying drawings in which.

DETAILED DESCRIPTION OF THE PREFERRED EMBODIMENTS

Figure 3:
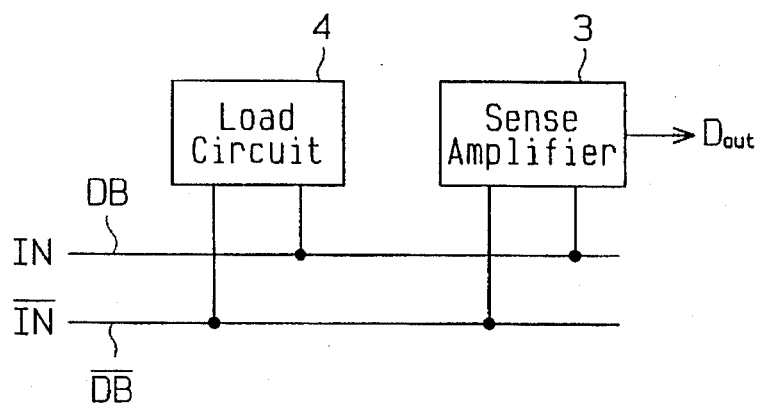
FIG. 3 is a schematic diagram illustrating the essential parts of a semiconductor memory device according to the present invention.

A semiconductor memory device according to a basic embodiment according to the invention is shown in FIG. 3. The basic embodiment of the semiconductor memory device includes a pair of data buses DB and /DB through which cell data is read, and a sense amplifier 3 and a load circuit 4 which are connected to the pair of the data buses. The sense amplifier 3 is enabled during a data reading operation and produces an output data signal $D_{OUT}$ based on the voltage potentials of transfer signals IN and /IN on the data buses DB and /DB. During the data reading operation, the transfer signals IN and /IN on the data buses have a different voltage potential from each other. The load circuit 4 causes the data buses DB and /DB to be set at a predetermined reset voltage potential in a reading operation standby state. The predetermined reset voltage potential is intermediate between the voltage potentials of the data buses when the sense amplifier is thereafter operating.

The data outputting control circuit of a dynamic random access memory (DRAM) according to an embodiment of the present invention will now be described with reference to FIGS. 4 to 7. Like or same reference numerals are given to components corresponding or identical to the components of the above-described conventional circuit.

Figure 4:
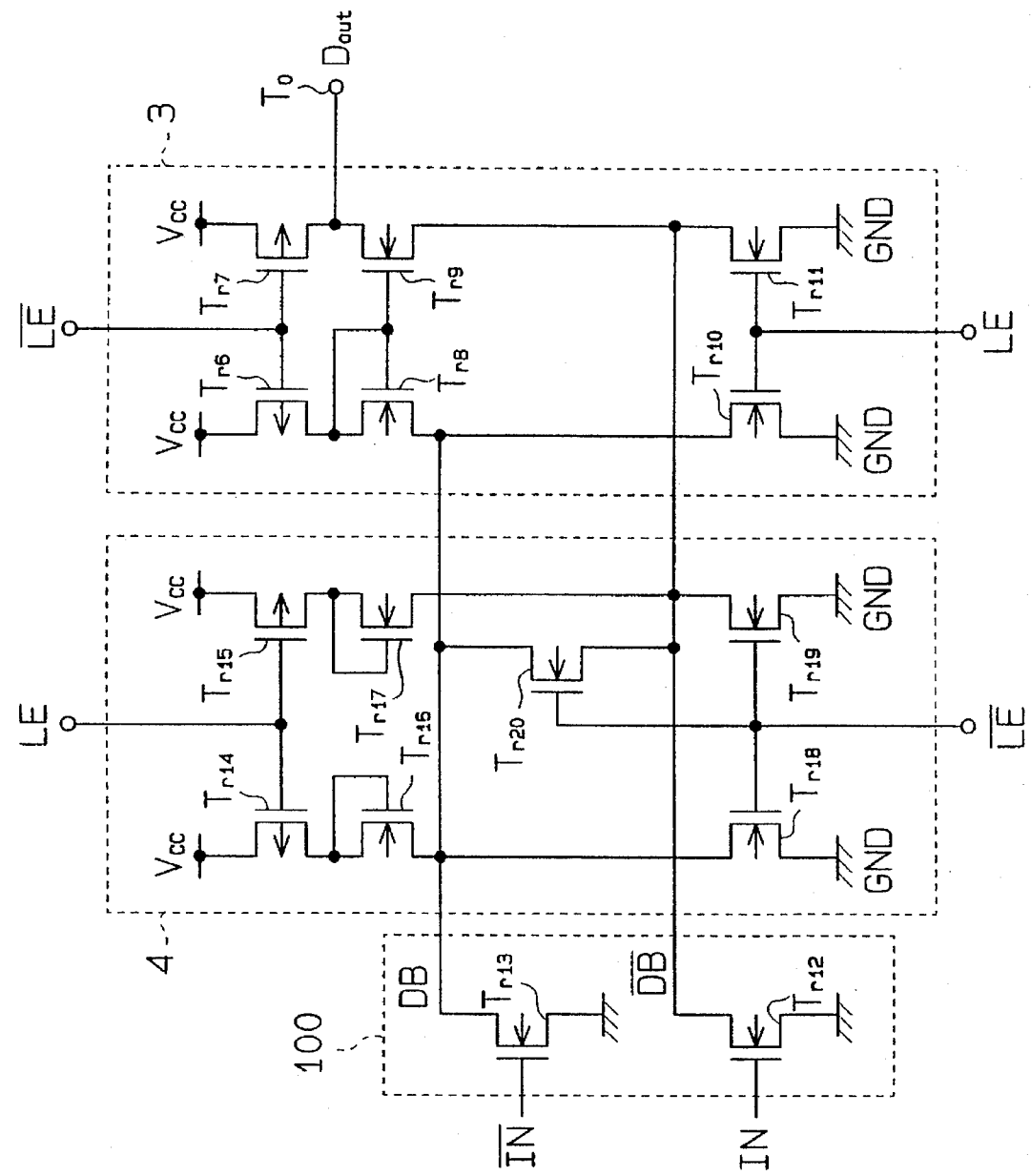
FIG. 4 is a circuit diagram illustrating a data outputting circuit according to an embodiment of the present invention.

As shown in FIG. 4, a switch circuit 100 has two N channel MOS transistors Tr12 and Tr13. The transistor Tr13 has a drain connected to a data bus DB and a source grounded. The transistor Tr12 has a drain connected to a data bus /DB and a source grounded. The gates of the transistors Tr12 and Tr13 are connected to a pair of complementary bit lines (not shown) to receive complementary input signals IN and /IN indicating cell data read from one of memory cells (not shown).

Figure 1:
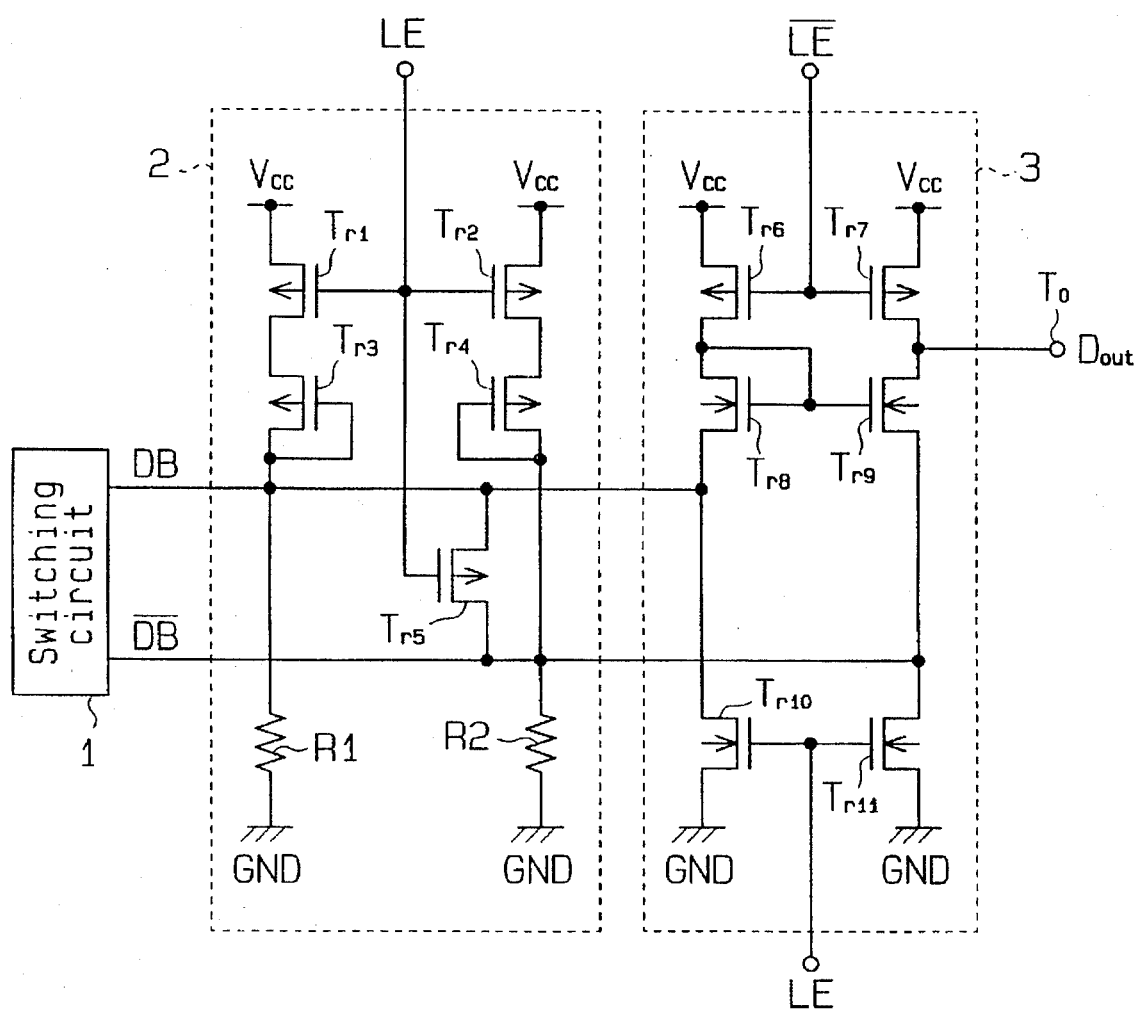
FIG. 1 is a circuit diagram illustrating a conventional data outputting circuit.
Figure 2:
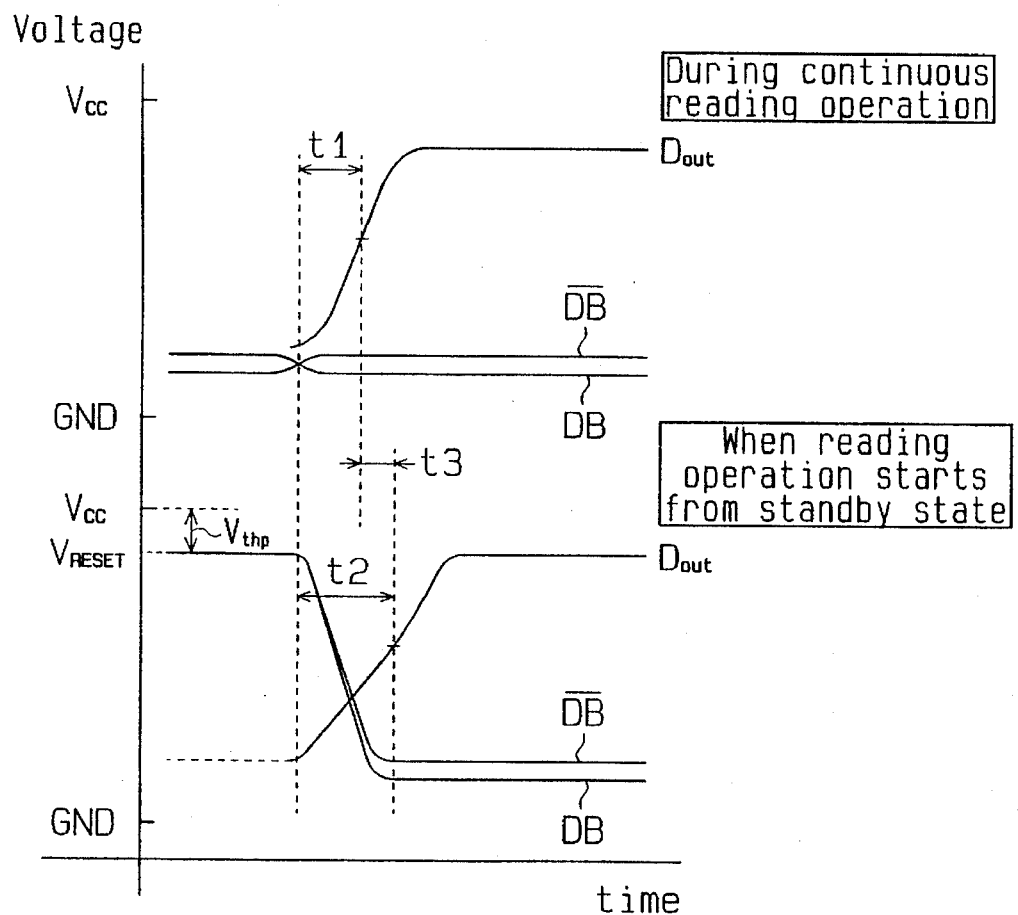
FIG. 2 is a timing chart of the operation of the circuit shown in FIG. 1.

The data buses DB and /DB are connected to a load circuit 4 as well as a sense amplifier 3 which has the same circuit structure as the sense amplifier 3 shown in FIG. 1. The load circuit 4 includes two P channel MOS transistors Tr14 and Tr15 and five N channel MOS transistors Tr16 to Tr20. The current driving performance of each of the transistors Tr14 to Tr19 is negligible compared with the current driving performance of the transistors Tr6 to Tr11 in the sense amplifier 3.

Each of the transistors Tr14 and Tr15 has a source connected to a power supply $V_{CC}$ and a gate receiving a sense amplifier enable signal LE. The transistor Tr14 further has a drain connected to the drain and gate of the transistor Tr16. The transistor Tr16 has a source connected to the data bus DB. The transistor Tr15 further has a drain connected to the drain and gate of the transistor Tr17. The transistor Tr17 has a source connected to the data bus /DB.

The transistor Tr18 has a drain connected to the data bus DB and a source grounded. The transistor Tr19 has a drain connected to the data bus /DB and a source grounded. The data buses DB and /DB are connected to each other via the N channel MOS transistor Tr20. The gates of the transistors Tr18, Tr19 and Tr20 are supplied with an inverted sense amplifier enable signal /LE. In the load circuit 4, a pair of series-connected P channel and the N channel MOS transistors are placed between the power supply $V_{CC}$ and the data bus DB or /DB. One N channel MOS transistor Tr18 is placed between the ground and the data bus DB or /DB.

The resistance RV14 of the transistor Tr14 when turned on is equal to the resistance RV15 of the transistor Tr15 when turned on. The resistance RV16 of the transistor Tr16 when turned on is equal to the resistance RV17 of the transistor Tr17 when turned on. The resistance RV18 of the transistor Tr18 when turned on is equal to the resistance RV19 of the transistor Tr19 when turned on. Accordingly, the resistance values RV14 to RV19 satisfy the following equation (2).

$$RV14:RV16:RV18=RV15:RV17:RV19 \quad (2)$$

Also, the resistance values RV6 to RV11 of the transistors Tr6 to Tr11 in the sense amplifier 3 satisfy the following equation (1), like the sense amplifier shown in FIG. 1.

$$RV6:RV8:RV10=RV7:RV9:RV11 \quad (1)$$

Furthermore, in this embodiment, the resistance values RV6 to RV19 satisfy the following equations (3) and (4).

$$(RV6+RV8):RV10=(RV14+RV16):RV18 \quad (3)$$

$$(RV7+RV9):RV11=(RV15+RV17):RV19 \quad (4)$$

The operation of the data outputting circuit shown in the FIG. 4 will now be discussed with reference to the timing chart of FIG. 5. For continuous reading of cell data, the sense amplifier enable signal LE should be set high and the signal /LE set low. Then the transistors Tr14, Tr15, Tr18, Tr19 and Tr20 of the load circuit 4 are turned off so that the load circuit 4 becomes disabled. In this case, the transistors Tr6, Tr7, Tr10 and Tr11 are turned on so that the sense amplifier 3 becomes enabled.

Figure 5:
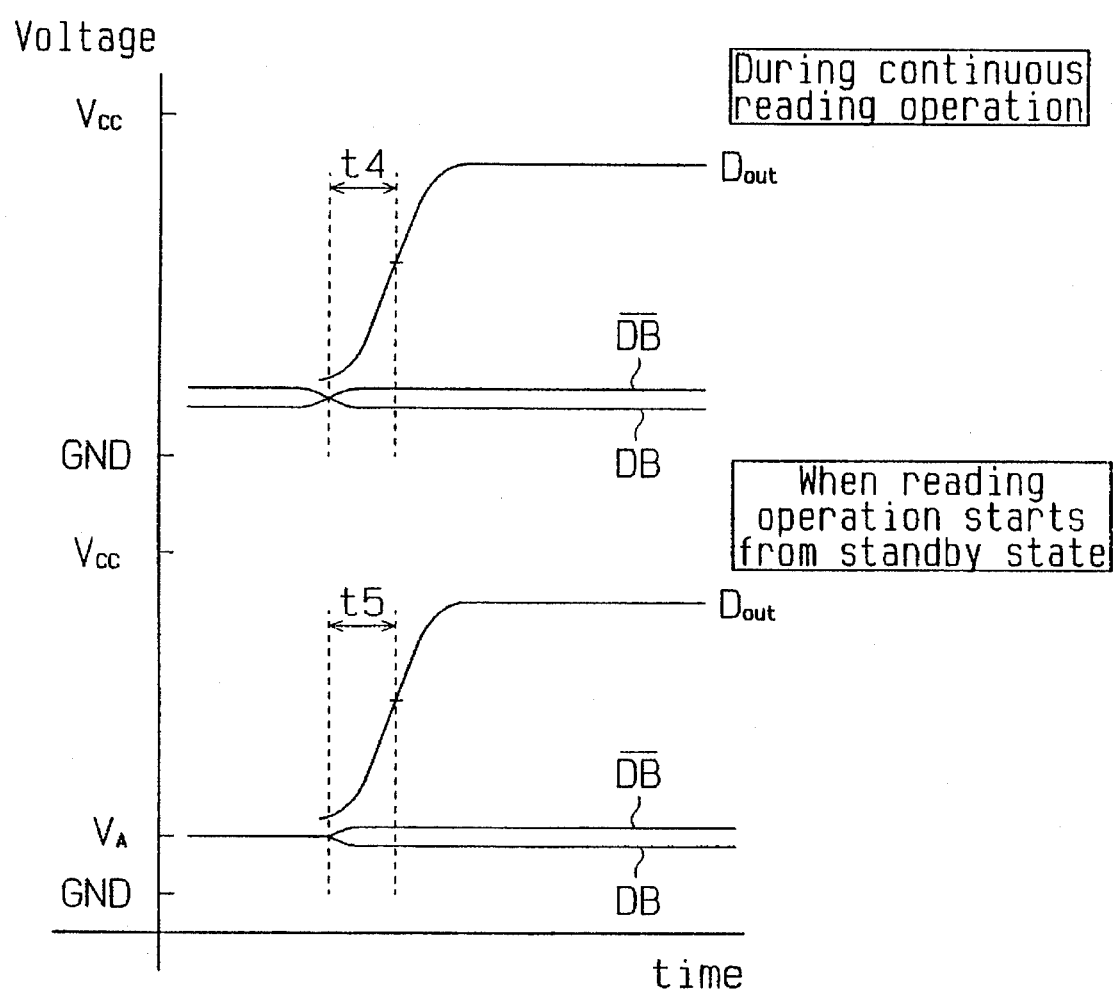
FIG. 5 is a timing chart of the reading operation of the circuit shown in FIG. 4.

As shown in FIG. 5, when the potential level of the data bus DB changes low from high and the potential level of the data bus /DB changes high from low in response to the reading of new cell data, it takes a reading period of time t4 for an output data signal $D_{OUT}$ to change its potential level.

In order to set the data outputting circuit to the standby state of reading operation, the sense amplifier enable signal LE needs to be set low and the signal /LE needs to be set high. In this case, the load circuit 4 becomes enabled and the sense amplifier 3 becomes disabled. The data buses DB and /DB have a voltage potential determined by dividing the potential difference between the supply voltage $V_{CC}$ and the ground level, following the resistance ratio represented by the equation (2). The determined voltage potential is a reset potential $V_4$ which has an intermediate potential level between the voltage potential levels of the data buses DB and /DB when the sense amplifier 3 is operating to output cell data read on those data buses.

On switching the data outputting circuit from standby state to the data reading operation mode, the sense amplifier enable signal LE needs to be set high and the signal /LE needs to be set low, so that the load circuit 4 becomes disabled and the sense amplifier 3 becomes enabled.

Just after the signal LE is set high, the potential level of the data buses DB and /DB as determined by the enabled sense amplifier 3, is very close to the reset potential $V_A$ of the data buses when the sense amplifier was disabled. This allows cell data to be promptly read to the data buses DB and /DB, resulting in a prompt separation of the voltage potentials of the data buses DB and /DB. Thus, the sense amplifier 3 can promptly produce an output data signal $D_{OUT}$ according to the read cell data at the terminal $T_O$.

It takes an operational period of time t5 for the output data signal $D_{OUT}$ to change its potential level, as shown in FIG. 5. The operational time period t5 is substantially equal to the reading time t4 during continuous reading operation.

The data outputting circuit according to the present invention improves the data reading speed at an initial stage of data reading operation.

According to the present embodiment, the four transistors Tr8, Tr9, Tr10 and Tr11 in the sense amplifier 3 and the four transistors Tr16, Tr17, Tr18 and Tr19 in the load circuit 4 are, all, N channel MOS transistors. Accordingly, the eight NMOS transistors can be formed on the same substrate at the same producing step in a wafer producing process. Even when the quality of produced circuit elements varies at every steps in a wafer producing process, therefore, the characteristics of the eight NMOS transistors would vary in the same tendency. The correlation of the characteristics of the eight NMOS transistors would be constant, irrespective of manufacturing lots of data outputting circuits.

Unlike the present invention, in the conventional data outputting circuit shown in FIG. 1, the transistors Tr3 and Tr4 are of PMOS type, the transistors Tr8, Tr9, Tr10 and Tr11 are of NMOS type and the resistors R1 and R2 are provided in the load circuit 2. Accordingly, these circuit elements (Tr3, Tr4, Tr8–Tr11, R1 and R2) must be produced at three or more steps in a wafer producing process. Therefore, the tendency in the variation of the characteristics of the PMOS transistors Tr3 and Tr4 differs from the tendency in the variation of the characteristics of the NMOS transistors Tr8 to Tr11. Much more, the tendency in the variation of the characteristics of the PMOS transistors Tr3 and Tr4 differs from the tendency in the variation of the characteristics of the resistors R1 and R2. Therefore, the correlation of the characteristics of the circuit elements (Tr3, Tr4, Tr8–Tr11, R1 and R2) is likely to vary depending on the manufacturing lots of data outputting circuits.

From the embodiments of the present invention described above, it should be apparent to those skilled in the art that the present invention may be embodied in many other specific forms without departing from the spirit or scope of the invention. Particularly, it should be understood that the present invention may be embodied in the following forms.

Figure 6:
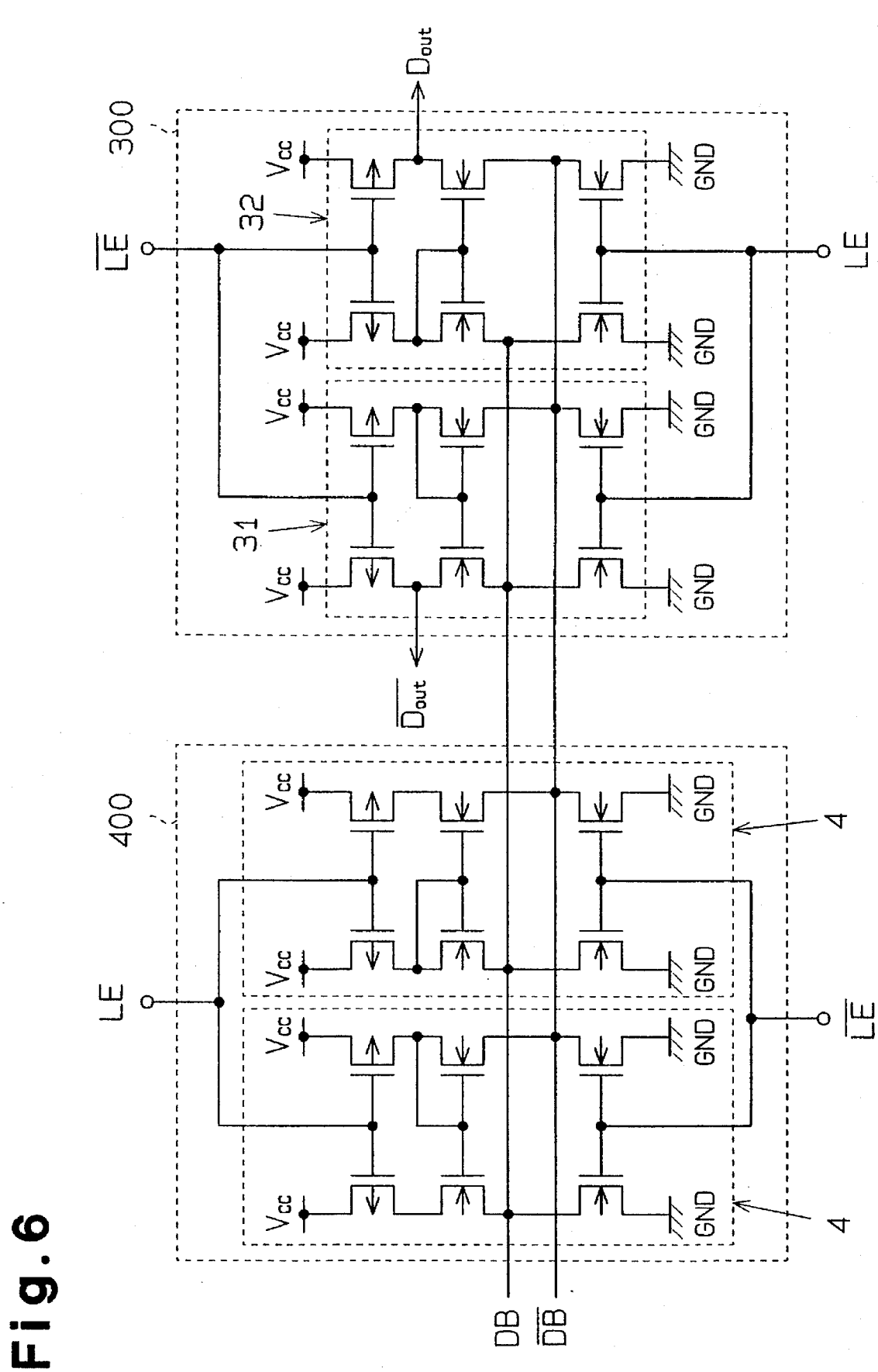
FIG. 6 is a circuit diagram illustrating another embodiment of data outputting circuit according to the present invention.

In the embodiment shown in FIG. 4, the sense amplifier 3 consists of a single current mirror circuit, and the single load circuit 4 is connected to the data buses DB and /DB. Another embodiment of the present invention is illustrated in FIG. 6. In the second embodiment, the data buses DB and /DB are connected to a sense amplifier 300 which consists of two current mirror circuit sections 31 and 32 to output a pair of complementary output signals $D_{OUT}$ and $/D_{OUT}$. In this case, the data buses DB and /DB should be connected to a load circuit 400 consisting of two load circuit sections 4 connected in parallel to the buses.

The circuit configuration shown in FIG. 6 balances the changes of the operation characteristic of the sense amplifier 300 due to the variations of the characteristics of transistors used therein with the changes of the operation characteristic of the load circuit 400, in order to balance the potential level of the data buses DB and /DB determined by the enabled sense amplifier 3 at an initial stage of data outputting operation with the reset voltage potential of the load circuit 400.

Figure 7:
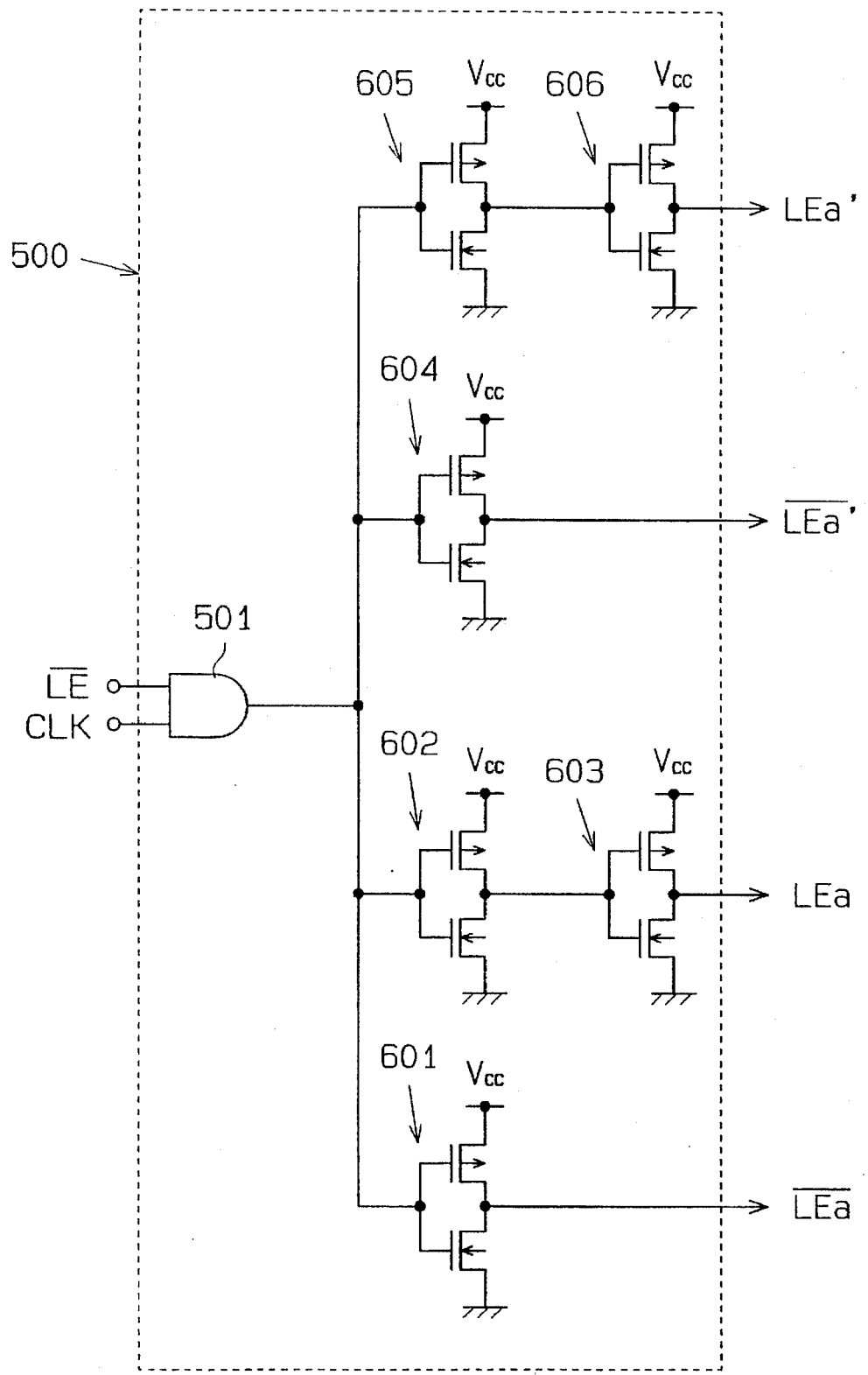
FIG. 7 is a circuit diagram illustrating an enable signal generating circuit for the load circuit.

In one modification which may be used with either of the above described embodiments, a pair of complementary signals LEa and /LEa and/or a pair of complementary signals LEa' and /LEa' are generated by an enable signal generating circuit 500 as shown in FIG. 7 to serve in place of the sense amplifier enable signals LE and /LE. The enable signal generating circuit 500 includes an AND gate 501 and six inverters 601, 602, 603, 604, 605 and 606. The AND gate 501 has a first input terminal receiving an inverted sense amplifier enable signal /LE and a second input terminal receiving a clock signal CLK. The output of the AND gate 501 is used to produce the signals LEa, /LEa, LEa' and /LEa'.

The use of the complementary signals LEa and /LEa reduces the power consumption of the load circuit 4 with the data buses DB and /DB at a desired reset voltage potential.

In the enable signal generating circuit 500, the current driving performance of a PMOS transistor in the first inverter 601 is smaller than that of an NMOS transistor in the first inverter 601. The current driving performance of a PMOS transistor in the second inverter 602 is smaller than that of an NMOS transistor in the second inverter 602. The current driving performance of a PMOS transistor in the third inverter 603 is larger than that of an NMOS transistor in the third inverter 603. The current driving performance of a PMOS transistor in the fourth inverter 604 is larger than that of an NMOS transistor in the fourth inverter 604. The current driving performance of a PMOS transistor in the fifth inverter 605 is larger than that of an NMOS transistor in the fifth inverter 605. The current driving performance of a PMOS transistor in the sixth inverter 606 is smaller than that of an NMOS transistor in the sixth inverter 606.

Since the load circuit 4 has a sufficiently small load driving performance, the load circuit 4 may be supplied with a ground level potential signal instead of the sense amplifier enable signal LE and also with a signal of supply voltage $V_{CC}$ instead of the signal /LE, to allow the load circuit 4 to stay enabled regardless of whether the sense amplifier is enabled or disabled.

It is to be understood that the MOS transistors in the sense amplifier 3 and the load circuit 4 in the above described embodiments can be replaced with other devices such as, for example, bipolar type transistors.

Therefore, the present examples and embodiments are to be considered as illustrative and not restrictive and the invention is not to be limited to the details given herein, but may be modified within the scope of the appended claims.

What is claimed is:

1. A semiconductor memory device, provided with a pair of data buses through which cell data is read, said memory device comprising:

a sense amplifier, connected to said pair of data buses, for producing an output data signal in accordance with voltage potentials of transfer signals on said pair of data buses; and a load circuit, connected to said pair of data buses, for setting said data buses at a predetermined reset voltage potential during a stand-by state of said memory device, wherein said predetermined reset voltage potential is intermediate between different voltage potential levels of said transfer signals on said data buses during a data reading operation of said memory device.

2. The semiconductor memory device according to claim 1, wherein said load circuit comprises:

at least one upper load circuit transistor connected between a high potential power supply and one of the data buses, and at least one lower load circuit transistor connected between the one of the data buses and a low potential power supply; and at least one upper load circuit transistor connected between the high potential power supply and the other of the data buses, and at least one lower load circuit transistor connected between the other of the data buses and the low potential power supply, and wherein said predetermined reset voltage potential for each of the data buses is respectively determined by a ratio of the resistance of said at least one upper load circuit transistor when turned on to the resistance of said at least one lower load circuit transistor when turned on.

3. The semiconductor memory device according to claim 2, wherein said sense amplifier comprises:

at least one upper sense amplifier transistor connected between the high potential power supply and one of the data buses, and at least one lower sense amplifier transistor connected between the one of the data buses and the low potential power supply; and at least one upper sense amplifier transistor connected between the high potential power supply and the other of the data buses, and at least one lower sense amplifier transistor connected between the other of the data buses and the low potential power supply.

4. The semiconductor memory device according to claim 3, wherein said ratio of the resistance of said at least one upper load circuit transistor when turned on to the resistance of said at least one lower load circuit transistor when turned on is equal to a ratio of the resistance of said at least one upper sense amplifier transistor when turned on to the resistance of said at least one lower sense amplifier transistor when turned on.

5. The semiconductor memory device according to claim 4, wherein said upper load circuit transistors, said lower load circuit transistors, said upper sense amplifier transistors and said lower sense amplifier transistors are of the same conductive type.

6. The semiconductor memory device according to claim 1, wherein said load circuit comprises:

a first upper resistive circuit connected between a high potential power supply and one of the data buses, and a first lower resistive circuit connected between the one of the data buses and a low potential power supply; and a second upper resistive circuit connected between the high potential power supply and the other of the data buses, and a second lower resistive circuit connected between the other of the data buses and the low potential power supply, and wherein said predetermined reset voltage potential for each of the data buses is respectively determined by a ratio of the resistance of each of said first and second upper resistive circuits to the resistance of each of said first and second lower resistive circuits.

7. The semiconductor memory device according to claim 6, wherein said sense amplifier comprises:

a first upper resistive circuit connected between the high potential power supply and one of the data buses, and a first lower resistive circuit connected between the one of the data buses and the low potential power supply; and a second upper resistive circuit connected between the high potential power supply and the other of the data buses, and a second lower resistive circuit connected between the other of the data buses and the low potential power supply.

8. The semiconductor memory device according to claim 7, wherein said ratio of the resistance of each of said first and second upper resistive circuits of said load circuit to the resistance of each of said first and second lower resistive circuits of said load circuit is equal to a ratio of the resistance of each of said first and second upper resistive circuits of said sense amplifier to the resistance of each of said first and second lower resistive circuits of said sense amplifier.

9. The semiconductor memory device according to claim 1, wherein said load circuit is controlled by complementary sense amplifier enable signals, which are externally supplied.

10. The semiconductor memory device according to claim 1, wherein said load circuit is controlled by complementary enable signals generated by an enable signal generating circuit that includes an AND gate for receiving a clock signal and a sense amplifier enable signal.

11. The semiconductor memory device according to claim 1, wherein said load circuit includes at least one transistor, and said sense amplifier includes at least one transistor, and the current driving performance of each transistor in said load circuit is sufficiently smaller than the current driving performance of each transistor in said sense amplifier.

12. The semiconductor memory device according to claim 1, wherein the stand-by state of said memory device occurs prior to said memory read operations.

13. The semiconductor memory device according to claim 1, wherein said transfer signals on said data buses are set to said predetermined reset voltage potential during the standby state and at least until said sense amplifier is enabled.

14. A data outputting circuit for a semiconductor memory device, said data outputting circuit couples to a pair of data buses associated with said memory device, said data outputting circuit comprising:

a sense amplifier, connected to said pair of data buses, for producing an output data signal in accordance with voltage potentials on said data buses; and a load circuit, connected to said pair of data buses, for setting said data buses at a predetermined reset voltage potential during a stand-by state of said memory device, wherein said data outputting circuit operates in data read mode and a stand-by mode, wherein during the stand-by mode, said predetermined reset voltage potential set on said data buses is between the voltage potential levels of said data buses during the data reading mode, and wherein during the data reading mode, said sense amplifier is enabled and said data buses have a different voltage potential level from each other in accordance with data from the semiconductor memory device.

* * * * *